Dec. 30, 1969 B. L. JONES 3,487,324
PLURAL CHANNEL AMPLIFIER SYSTEM HAVING VARIABLE FEEDBACK MEANS
Filed Aug. 17, 1965
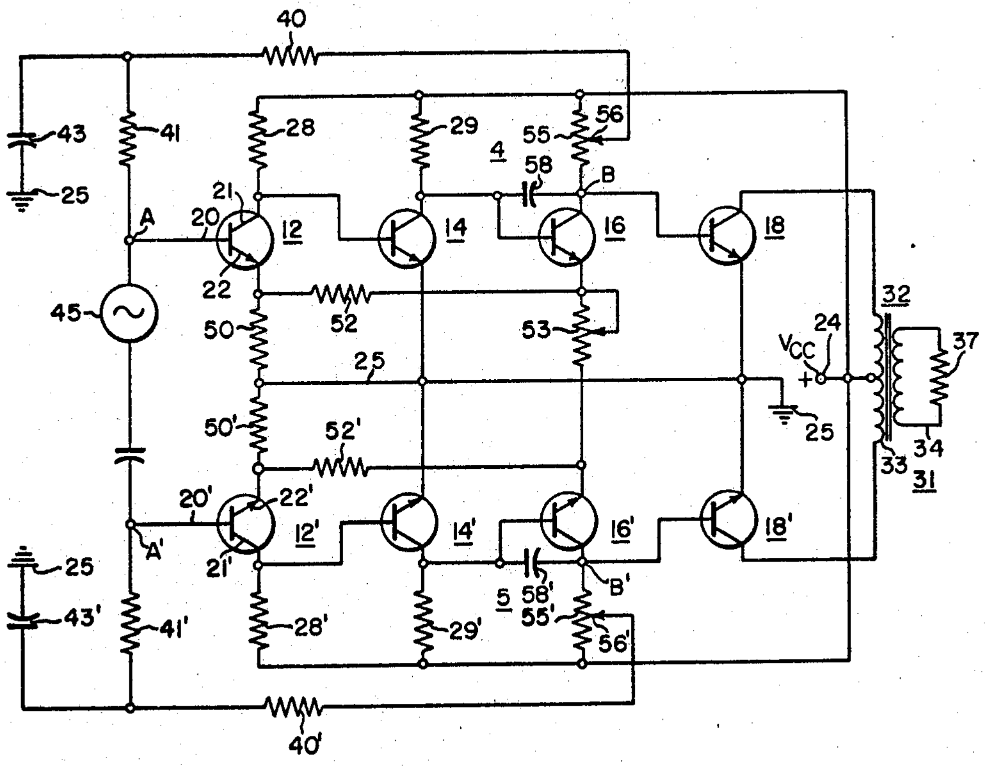
WITNESSES:
John L. Clopp
James H. Young
INVENTOR
Brian L. Jones
BY Sam Schron
ATTORNEY United States Patent Office 3,487,324

Patented Dec. 30, 1969

3,487,324

PLURAL CHANNEL AMPLIFIER SYSTEM HAVING VARIABLE FEEDBACK MEANS

Brian L. Jones, State College, Pa., assignor to Westinghouse Electric Corporation, Pittsburgh, Pa., a corporation of Pennsylvania Filed Aug. 17, 1965, Ser. No. 480,332
Int. Cl. H03f 3/68
U.S. Cl. 330—30 2 Claims

ABSTRACT OF THE DISCLOSURE

An amplifier system including two balanced channels each having a plurality of direct coupled transistors. An input signal is simultaneously applied to the first, or input, transistor of each channel and an output load means is commonly connected to the last, or output, transistor of each channel. The base of the output transistor is connected to the base of the input transistor in each respective channel for D.C. feedback regulation and the emitter of the transistor preceding the output transistor and each channel is connected to the respective input transistor of each channel, for A.C. feedback regulation. A single variable resistor is connected between the two emitters for simultaneously varying A.C. feedback, and accordingly the gain and volume are automatically varied. The D.C. feedback may be varied by connection to a point intermediate the ends of a collector resistor of the transistor preceding the output transistor.

This invention in general relates to amplifier systems and more particularly to a low power, direct coupled temperature stabilized, balanced audio amplifier system which may be fabricated as an integrated circuit.

Technological advancements in the semiconductor art have led to the field of molecular electronics, also known by other names such as integrated circuitry, wherein a plurality of the electrical components are formulated on a single piece of semiconductor crystal. Circuits formulated by molecular electronic techniques range from the very simple, which may only include a few diodes, to the very complex including entire amplifier systems. Since the semiconductor chip upon which the circuit is formulated is very tiny, present day technology is limited to the value of capacitors which may be made for a given chip size. For this reason, the fabrication of linear amplifiers, in integrated circuit form, presents several design problems in that interstage coupling capacitors are normally too large to be incorporated in the molecular circuit. For this reason, a great number of audio amplifiers are made, utilizing direct coupling between stages.

Direct coupled amplifiers require exacting D.C. bias levels at various points in the amplifier system. Severely hampering the operation of direct coupled amplifiers is the fact that various parameters vary with temperature and therefore excessive and unwanted drifts caused by variation of transistor biases occur with variations in temperature. Although the transistor parameters per se are not excessively responsive to temperature, they vary with emitter current and collector-emitter voltage so that if these vary excessively with temperature, they will in turn produce a variation of the transistor parameters.

In order to stabilize the direct coupled amplifier system with respect to temperature, various direct coupled circuits employ a feedback arrangement wherein an emitter resistor is inserted in series with the emitter of the output transistor of the amplifier. This type of stabilization is highly unsatisfactory in circuits using a single and low valued power supply such as might be found in integrated circuits were the supply battery might be in the order of 1 or 1.5 volts. Since the power supply is limited, the voltage drop across an emitter resistor produced by signal currents in the transistor would represent waste since it reduces the power available for the output signal.

In copending application Ser. No. 480,331, filed Aug. 17, 1965, by M. J. Hellstrom and assigned to the assignee of the present invention, there is described and claimed, circuitry which eliminates the deficiencies of prior art circuits and is particularly well adapted for high stability, low voltage integrated circuits. Basically the circuitry of the aforesaid application Ser. No. 480,331 is directed to a two-channel balanced arrangement of direct coupled transistor stages with feedback stabilization.

It is a primary object of the present invention to provide a novel volume control for such circuits.

A further object is to provide an improved feedback arrangement for such circuits.

Briefly, in accordance with the above objects, there is provided an amplifier system having two balanced channels each channel having a plurality of direct coupled cascaded stages including an input transistor as the first stage and an output transistor as a last stage. The base electrode of each of the transistors is directly connected to the collector electrode of a previous transistor, except for the input transistor which receives an input signal. An output load means is connected in the collector-emitter circuit of the output transistor. The transistor preceding the output transistor has a tapped resistor connected to the collector thereof. Feedback means connects the variable tap with the base of the input transistor. The feedback action insures that the base bias condition of the output transistor is regulated and controllable, and consequently the collector current thereof will be regulated without the need for an output emitter resistance and without the need for sampling the output current.

The balanced or symmetrical arrangement has an input signal applied to the input transistor of each channel and an output load means connected to the output electrode of each of the output transistors. In order to vary the gain of the symmetrical circuit, a variable resistor is connected between emitter electrodes of two transistors, one in each channel, and is operative in conjunction with A.C. feedback means to control volume.

To obtain similar base-emitter voltage drops in the various transistors in addition to insuring similar drifts with respect to temperature, of the various transistors, the amplifier system is preferably fabricated as an integrated circuit.

The above stated as well as further objects and advantages of the present invention will become apparent upon a reading of the following detailed specification taken in conjunction with the drawing, illustrating the present invention.

Referring now to the figure, the amplifier system includes a plurality of direct coupled cascaded transistors 12, 14, 16 and 18 with transistor 12 constituting an input transistor, and transistor 18 constituting an output transistor. Transistor 12, as well as the other transistors, includes an input or a base electrode 20, an output or collector electrode 21 and a common or emitter electrode 22. The term amplifier, or amplifier system, utilized herein is meant to include both amplifiers and preamplifiers. The figure illustrates a symmetrical circuit wherein transistors 12, 14 and 16 may constitute a preamplifier, and transistor 18, an output amplifier stage of a first channel 4. The symmetrical components, including transistors 12', 14', 16' and 18' are identical to their unprimed counterparts and form a second channel 5.

Each of the transistors 12, 14 and 16 has a corresponding collector resistor 28, 29 and 55 respectively, each of which is connected to terminal means 24 to which may be applied a suitable source of operating potential $V_{CC}$.

The output transistor 18, and its symmetrical counterpart 18' is connected to a load means 31 illustrated by way of example as comprising transformer 32 having a primary winding 33 and a secondary winding 34. Each end of the primary winding 33 is connected to a respective output transistor collector electrode and the center tap of primary winding is connected to terminal 24. The secondary winding 34 is connected to a load impedance 37. With the circuit utilized as an audio amplifier, the output means 31 may constitute a speaker or ear plug arrangement. Alternatively, the output means could include a bridge type, or differential output arrangement.

The base of input transistor 12 has been labeled A, and the base of output transistor 18 has been labeled B. Feedback means have been provided in a well known manner, connecting point A with point B, and take the form of resistors 40 and 41 with the junction therebetween being capacitively coupled by means of capacitor 43, to ground 25 to filter out any A.C. component so that a pure D.C. feedback is obtained. The same connections with primed reference numerals also holds true. An input signal source 45 is capacitively coupled to both of inputs 20 and 20' constituting the base electrode of transistors 12 and 12' respectively. In a typical application as an audio amplifier, the input signal source 45 is a microphone.

The circuit finds particular application for use in extremely small hearing aids and when formulated as an integrated circuit, the power supply $V_{CC}$ would be in the order of 1.5 volts. For the amplifier system illustrated, as well as other transistor systems, the transistors must be biased at a certain D.C. quiescent biasing point which must be accurately maintained in spite of varying temperature tending to cause parameter and current variations. In the figure, the D.C. bias condition will be accurately maintained by maintaining prescribed conditions at point A (the base of transistor 12). Since point A is resistively connected to point B, the conditions at point B, and consequently the base bias conditions of transistor 18, are accurately maintained.

The preamplifier section comprising transistors 12, 14 and 16 is a standard well-known direct coupled feedback network having an odd number of stages. Basically, if any of the D.C. operating points tend to vary, the feedback action will be operative to bring the circuit back to its quiescent operating point. By way of example, suppose that the voltage at point B tends to rise due to some objectionable temperature variation. This increase in voltage is fed back to the base of input transistor 12 via resistors 40 and 41. An increasing base voltage causes the output voltage at the collector of transistor 12 to decrease, thus decreasing the input signal to transistor 14, the output voltage of which rises and is applied to the input of transistor 16 to thereby bring the voltage back down to its designed operating point. Conversely, suppose that the voltage at point B decreases. A similar type of operation occurs to again bring back the operating point B to its quiescent value. A decreasing voltage at point B applied to the input transistor 12 causes the output thereof to increase. The increasing output signal applied to transistor 14 causes its output in turn to decrease which when fed to transistor 16 causes an increased output signal therefrom, thereby bringing up the signal to its designed value. The unique cooperation of the output stage with this standard circuit serves to control the D.C. quiescent operating current in the collector-emitter current path of the output transisor 18 by actually controlling the base bias conditions of the transistor 18. This accurate control of the output transistor 18 is accomplished without the need for a large emitter resistor which would provide an objectionable voltage drop when input signals are supplied by the microphone 45. By virtue of the combination, the D.C. quiescent current of the output transistor 18 is additionally maintained without the need for sampling and feeding back any output signal from the output transistor 18.

In order to provide a convenient control over the bias current in the output transistor 18, and in order to obtain a predetermined desired feedback level, there is provided a resistor 55 connected to the collector of transistor 16. Resistor 55 has a variable tap 56 which, preferably, may be set to sample a portion of the voltage across resistor 55. If the circuit is fabricated as an integrated circuit, the tap 56 could be located at a position somewhere intermediate the ends of resistor 55, depending upon the particular design configurations.

Microphone 45 applies input signals to the base electrode of both input transistors 12 and 12'. With an input signal differentially applied, as illustrated, channel 4 amplifies positive going signals at the same time that channel 5 amplifies negatively going signals and vice versa. In other words, the signals being amplified in each of the channels are 180° out of phase. With this arrangement, the two output transistors 18 and 18' are driven in and out of phase relationship by the signals in channels 4 and 5, respectively. The output means is connected in the output circuit of both of these transistors. The primary winding 33 of output means 31 has one end connected to the collector electrode of output transistor 18 and has the other end thereof connected to the collector electrode of output transistor 18'.

Resistors 50 and 52 are included to obtain better gain control in the circuit and form part of an A.C. feedback arrangement. Resistor 50 connects the emitter of transistor 12 with the common circuit point 25 and the emitter of transistor 16 is connected through resistor 52 to the junction between resistor 50 and the emitter of input transistor 12.

When used as a hearing aid amplifier, it would be desirable to be able to control the volume, and means are provided in the circuit for varying the gain of the circuit upon the application of input signals. The volume control includes a potentiometer 53 connecting similar electrodes of transistors in the channels 4 and 5, that is the emitters of both transistors 16 and 16'. With no connection between these emitters, that is, essentially infinite impedance, there is, when an A.C. signal is applied, a negative feedback from the emitters of transistors 16 and 16' through resistors 52 and 52' and 50 and 50' of channels 4 and 5. This negative feedback tends to reduce the gain thereby providing a lower amplification. Conversely, with a low resistance connecting the emitters of transistors 16 and 16', the out of phase A.C. signals cancel each other out and there is essentially produced an A.C. ground. With the A.C. signals essentially grounded, there is no A.C. feedback through resistors 52 and 52' and the gain is at a higher level. By adjusting the potentiometer 53 the gain may be varied until a desired volume level is reached.

The low voltage battery connected to terminal 24 has an internal resistance which increases with normal deterioration of the battery. As this battery resistance increases, there is an effective coupling through the battery, beween the third stage transistor 16 and an earlier stage transistor such as 12 (the same is true of transistors 16' and 12') and an undesirable oscillation sometimes occurs. In many instances other forms of oscillation will occur even when the battery resistance is low. In order to prevent the undesirable oscillation, there is provided a low valued capacitor 58 connecting the collector electrodes of two adjacent transistors. A more effective cancellation takes place when the collector electrodes of the third stage transistor 16 and the previous stage transitsor 14 are connected together. In a similar manner the low valued capacitor 58' connects the collector electrode of transistor 16' with the collector electrode of the preceding transistor 14'. The value of capacitance utilized will depend upon design considerations and it is within the range for fabrication in an integrated circuit. A typical value of capacitance utilized may be in the order of 80 picofarads. The capacitors form no part of the present invention but are claimed in the aforesaid application Ser. No. 480,331.

Accordingly, there has been provided an improved temperature stabilized two-channel D.C. amplifier which may be fabricated by integrated circuit techniques and in which feedback and gain may be advantageously controlled.

Although the invention has been described with a certain degree of particularity, it is to be understood that modifications may be made thereto without departing from the spirit and scope of the invention, but that other embodiments are made possible in light of the above teachings.

What is claimed is:

1. An amplifier system comprising:

a first preamplifier including an input transistor and a plurality of subsequent cascaded transistor stages;

first feedback means coupling the last transistor of said first preamplifier to the input transistor of said first preamplifier for D.C. feedback regulation;

a second preamplifier including an input transistor and a plurality of subsequent cascaded transistor stages;

second feedback means coupling the last transistor of said second preamplifier to the input transistor of said second preamplifier for D.C. feedback regulation;

first and second output transistors electrically connected to the last transistor of said first and second preamplifiers, respectively;

means for differentially applying an input signal to said input transistors;

load means commonly connected in the output circuit of both said first and second output transistors;

a variable resistor having opposite ends between which resistance values may be established and having said opposite end connected between the emitter electrode of the last transistor of said first preamplifier and the emitter electrode of the last transistor of said second preamplifier;

first and second A.C. feedback means respectively connected to said opposite ends of said variable resistor and to respective input transistors of said first and second preamplifiers whereby varying said resistance value simultaneously varies said A.C. feedback in each said preamplifier.

2. An amplifier system comprising:

a first and second preamplifier channel, each including a plurality of cascaded transistors, each channel for receiving and amplifying an input signal;

means connecting the emitter electrode of a last of said transistors of each said channel with the emitter electrode of a first of said transistors of each said channel, respectively for A.C. fedeback regulation;

resistance means connecting the emitter electrode of a first of said transistors of each channel to a common circuit point;

output means including load means commonly connected to the last transistor of both said first and second channels; and a single variable resistor connecting the emitter electrode of a last of said transistors of said first channel to the emitter electrode of a last of said transistors of said second channel for simultaneously and equally varying the A.C. feedback in each said channel.

References Cited

UNITED STATES PATENTS

| | | | |
|---|---|---|---|
| 2,901,556 | 8/1959 | Chapman et al. | 330—28 |
| 3,042,876 | 7/1962 | Pegram | 330—30 X |
| 3,046,487 | 7/1962 | Matzen et al. | 330—69 X |
| 3,188,576 | 6/1965 | Lewis | 330—28 X |

ROY LAKE, Primary Examiner

LAWRENCE J. DAHL, Assistant Examiner

U.S. Cl. X.R.

330—19, 26